United States Patent [19]
Fotowat-Ahmady et al.

[11] Patent Number: 5,790,943
[45] Date of Patent: Aug. 4, 1998

[54] DYNAMIC RANGE EXTENSION OF A LOG AMPLIFIER WITH TEMPERATURE AND PROCESS COMPENSATION

[75] Inventors: Ali Fotowat-Ahmady, San Rafael, Calif.; Mehran Ali-Ahmad, Toronto, Canada; Nasrollah Saeed Navid, Saratoga, Calif.

[73] Assignee: Philips Electronics North America Corporation, New York, N.Y.

[21] Appl. No.: 539,949

[22] Filed: Oct. 6, 1995

[51] Int. Cl.$^6$ .................................. H04B 17/00
[52] U.S. Cl. ........................ 455/226.2; 455/226.4
[58] Field of Search .................... 455/67.1, 67.7, 455/250.1, 254, 226.1, 226.2, 226.4; 327/350, 362, 513; 363/127

[56] References Cited

U.S. PATENT DOCUMENTS 4,742,565  5/1988  Iwahashi ..................... 455/250.1
4,939,788  7/1990  Hasegawa ..................... 455/250.1
5,296,761  3/1994  Fotowat-Ahmady et al. ........ 307/492
5,338,985  8/1994  Fotowat-Ahmady et al. ........ 307/494

FOREIGN PATENT DOCUMENTS 0665639  1/1994  European Pat. Off. ......... H03D 1/00
0639901  2/1995  European Pat. Off. ......... 455/226.2
3-214927  9/1991  Japan ..................... 455/226.4

*Primary Examiner*—Nguyen Vo
*Attorney, Agent, or Firm*—Brian J. Wieghaus

[57] ABSTRACT

A new addition to log amplifiers for received signal strength indication in cellular telephony and telecommunications applications extends the large signal end of the signal strength curve by adding rectifiers to the input of an intermediate frequency amplifier, without degrading the noise figure or impedance characteristics thereof. The new addition to log amplifier outputs a signal which is linearly related to an input signal to the log amplifier.

14 Claims, 9 Drawing Sheets

DYNAMIC RANGE EXTENSION OF A LOG AMPLIFIER WITH TEMPERATURE AND PROCESS COMPENSATION

1. BACKGROUND OF THE INVENTION

A. Field of the Invention

The present invention relates to logarithmic (log) amplifiers for received signal strength indication (RSSI) in cellular telephony and telecommunications applications, and specifically, to log amplifiers for RSSI which extend a large signal end of a signal strength curve by adding rectifiers to the input of a first intermediate frequency (IF) amplifier, without degrading the noise figure (NF) or impedance characteristics of the log amplifiers.

B. Description of the Related Art

A five-stage intermediate frequency (IF) amplifier with an interstage filter receives an incoming analog signal, introduces gain to the received, incoming analog signal, and outputs an amplified version of the received, incoming analog signal as an analog output signal. The above-mentioned five-stage intermediate frequency (IF) amplifier with an interstage filter introduces the gain using five amplifiers, each amplifier corresponding to one of the five stages. In addition, a five-stage intermediate frequency (IF) amplifier with an interstage filter determines the signal strength of the received, incoming analog signal, and outputs a received signal strength indication (RSSI) signal.

A five-stage intermediate frequency (IF) amplifier may be implemented in various ways. One example of a five-stage intermediate frequency (IF) amplifier with an interstage filter is described in U.S Pat. No. 5,338,985 to Fotowat-Ahmady et al., issued Aug. 16, 1994, and U.S. Pat. No. 5,296,761 to Fotowat-Ahmady et al., issued Mar. 22, 1994.

FIG. 1 shows a block diagram of one example of a conventional five-stage intermediate frequency (IF) amplifier 10 with an interstage filter and log signal level detector. In the five-stage intermediate frequency (IF) amplifier 10 with interstage filter and log signal detector of FIG. 1, conventional limiter/amplifiers 12, 14, 18, 20, and 22 are connected in series with each other, forming five stages. Further, band-pass filter 16 is connected in series with, and between, amplifiers 14 and 18. Amplifiers 12, 14, 18, 20, and 22 increase the strength of input signal input 1 in five stages of 20 decibels (db) of gain each, thereby introducing a total of 100 db of gain into input 1. Band-pass filter 16 removes low-frequency and high-frequency components from input 1. Input 1 is then output from the five-stage limiter/amplifiers 12, 14, 18, 20 and 22 as analog signal output 1.

Also as shown in FIG. 1, a second output of each of the amplifiers 12 and 14 is transmitted to "weighting factor and rectification" circuit 21. In addition, a second output of each of amplifiers 18, 20, and 22 is transmitted to "weighting factor and rectification" circuit 23. The above-mentioned "weighting factor and rectification" circuit 21 adjusts the value of the second output of each of amplifiers 12, and 14, to compensate for the loss of in-band signal introduced by filter 16.

After "weighting factor and rectification" circuit 21 outputs analog signal irec1 to temperature correction circuit 28. Examples of specific implementations of the abovedescribed functions are disclosed in U.S. Pat. No. 5,338,985.

"Weighting factor and rectification" circuit 21 is coupled to temperature correction circuit 28, which corrects for the influence of temperature on irec1. Temperature correction circuit 28 outputs current icor1, the value of which is independent of temperature variations. The transfer function of temperature correction circuit 28 is $I_F/RI_{ptat}$. $I_{ptat}$ is referred to as the "PTAT" current and is a current generated by a current source (not shown in FIG. 1), which is proportional to absolute temperature; therefore, as the temperature increases, the value of $I_{ptat}$ increases. $I_F$ is a fixed current provided by a current source (not shown in FIG. 1) in which current is fixed with respect to temperature. Irec1 is multiplied by the above-mentioned transfer function by temperature correction circuit 28. Accordingly, temperature correction circuit 28 converts signal irec1 to a signal which remains relatively fixed as the temperature changes. Examples of temperature correction circuits are provided in U.S. Pat. Nos. 5,338,985 and 5,296,761 to Fotowat-Ahmady et al.

Likewise, the second outputs of each of amplifiers 18, 20, and 22 are input to "weighting factor and rectification" circuit 23. "Weighting factor and rectification" circuit 23 adjusts the value of the second output of each of amplifiers 18, 20, and 22, full-wave rectifies and outputs the d.c. component of the above-mentioned second outputs of amplifiers 18, 20, and 22, respectively. After "weighting factor and rectification" circuit 23 outputs analog signal irec2 to temperature correction circuit 30. Temperature correction circuit 30 performs the same function on irec2 as does temperature correction circuit 28 on signal irec1. Temperature correction circuit 30 outputs signal icor1.

As shown in FIG. 1, icor1 and icor2 are each input to converter 32. Converter 32 adds icor1 and icor2, and converts the cumulative current to a voltage, which is the received signal strength indication (RSSI) signal. Converter 32 is conventionally implemented. Converter 32 then outputs the received signal strength indication (RSSI) signal. The RSSI signal is a voltage whose value is relative to the logarithm of the strength of input 1. The RSSI signal is an indication of the strength of the signal received from a base station and is used, for example, in determining when to switch a cellular telephone call between cells.

One example of one amplifier stage 18 of the five stages of five-stage intermediate frequency (IF) amplifier 10 with an interstage filter and log signal level detector is shown in FIG. 2.

As shown in FIG. 2, the amplifier stage 18 amplifies, and "weighting factor and rectification" circuit 23 full-wave rectifies, and extracts a d.c. component proportional to the amplitude of input signal Vin. One example of Vin is input signal FO1 to amplifier 18 of FIG. 1. One example of Vout is signal AO3 of FIG. 1.

In FIG. 2, when the non-inverting (+) input to amplifier stage 18 is more positive with respect to the inverting input (−), npn transistor Q1P is turned on, and the non-inverting output (+) of Vout becomes less positive with respect to the inverting (−) output Vout. Further, when the inverting (−) input to amplifier stage 23 is more positive with respect to the non-inverting input (+), npn transistor Q2P is turned on, and the inverting output (−) of Vout becomes more positive with respect to the non-inverting (+) output Vout.

In addition, and also shown in FIG. 2, when the non-inverting (+) input of Vin is more positive than the inverting input transistor Q3P in the weighting and rectifying circuit 23 turns on and charges the capacitor C1 connected to the emitter of transistor Q3P to the peak value of a signal appearing at the emitter of Q3P.

The useful dynamic range, then, of the five-stage IF amplifier 10 shown in FIG. 1 may be from approximately −100 decibels per milliwatt (dbm) to −20 dbm, for a given input signal.

FIG. 3 is a diagram of an RSSI response for the five-stage IF amplifier shown in FIG. 1. As shown in FIG. 3, when the amplitude of the signal strength of input 1 is between −120 and −100 dbm, the RSSI signal is 100 millivolts (mv). When the amplitude of the signal strength of input 1 is between −100 dbm and approximately −20 dbm, the RSSI voltage is linearly-related, with a fixed slope to the logarithm of amplitude of the signal strength of input 1. However, as the signal strength of input 1 increases, the slope of the RSSI response begins to decrease. Further, the slope of the RSSI response decreases to 0 degrees, as the amplitude of the signal strength of input 1 increases to approximately −20 dbm. After −20 dbm, RSSI begins to decrease.

However, the related art suffers from a problem in that the related art has a limited dynamic range. If the input signal, input 1, is too large, the RSSI signal is not adequately related to the input signal.

2. SUMMARY OF THE INVENTION

An object of the present invention is to increase the useful dynamic range of a five-stage IF amplifier with an interstage filter and log signal level detector (also referred to as the five-stage IF amplifier) as an example by approximately 10 dB at the high end of the dynamic range.

Another object of the present invention is to increase the useful dynamic range with proper temperature and process compensation.

An additional object of the present invention is to add a rectifier circuit at the input of the five-stage IF amplifier before amplification of the input signal.

The present invention is a dynamic range extension of a conventional log amplifier, as described herein above, with temperature and process compensation. The present invention senses the very large signal component of the input to the conventional limiter/amplifier through a rectifier structure, herein after referred to as a "high end linear response circuit". After the other, above-described rectifier circuits have become functional, the high end linear response circuit of the present invention becomes functional, thereby increasing the received signal strength indication (RSSI) signal at the high end of the amplitude of the dynamic range of the conventional log detector output. The rectifier structure rectifies the input signal at the most sensitive part of the intermediate frequency amplifier for noise figure considerations of the limiter/amplifier circuit.

According to the rectifier structure of the present invention, the input signal is "rectified", as described herein below, before gain is added to the input signal by a limiter/amplifier. The d.c. level of the input signal, and the "rectified" signal plus the d.c. level of the input signal, are then level-shifted and peak-detected. The voltage difference between the foregoing signals is then determined, and that voltage difference is proportional to the amplitude of the input signal. The voltage difference is converted to a current, which is then added to the above-described temperature corrected currents by a converter, which then outputs the received signal strength indication (RSSI) signal as a voltage value. Therefore, according to the present invention, the received signal strength (RSSI) indication signal is linearly related to the input signal, for very large signals. Since the high end linear response circuit of the present invention is independent of the above-described $I_{PTAT}$, no compensation for temperature is needed in the present invention. Therefore, weighting of the "rectified" output of the high end linear response circuit of the present invention is combined with voltage-to-current conversion of the "rectified" output. The present invention, then, extends by more than 10 dB the conventional limiter/amplifier circuits RSSI signal at the high end of the dynamic range.

These together with other objects and advantages which will be subsequently apparent, reside in the details of construction and operation as more fully hereinafter described and claimed, reference being had to the accompanying drawings forming a part hereof, wherein like numerals refer to like parts throughout.

4. BRIEF DESCRIPTION OF THE DRAWINGS

Further details of the present invention are explained below, with the aid of the attached drawings in which.

5. DESCRIPTION OF THE PREFERRED EMBODIMENTS

Figure 1:
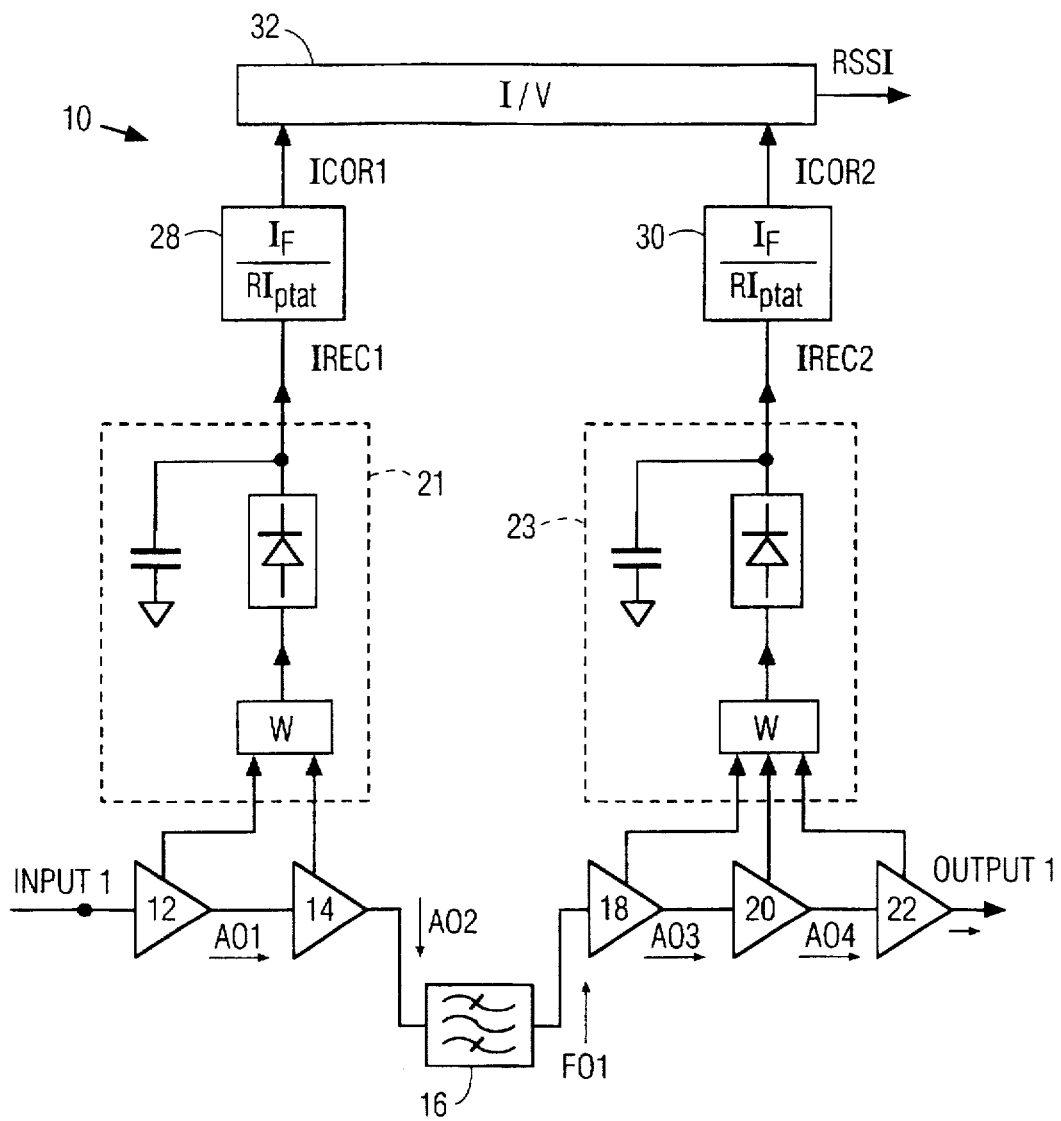
FIG. 1 is a block diagram of a prior art five-stage IF amplifier circuit.
Figure 2:
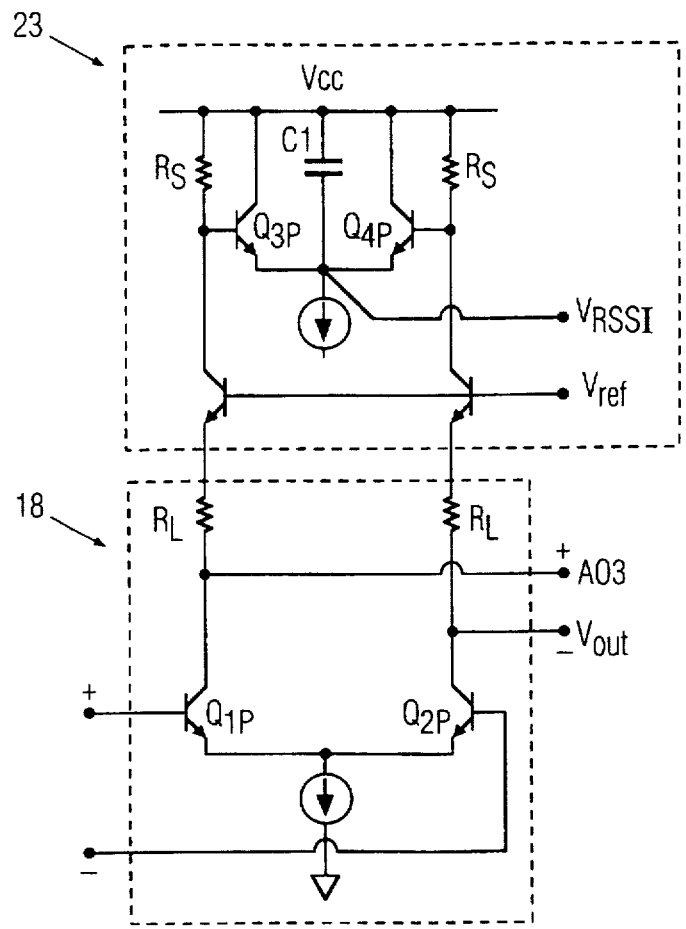
FIG. 2 is a circuit diagram of an amplifier stage in the prior art five-stage IF amplifier circuit.
Figure 3:
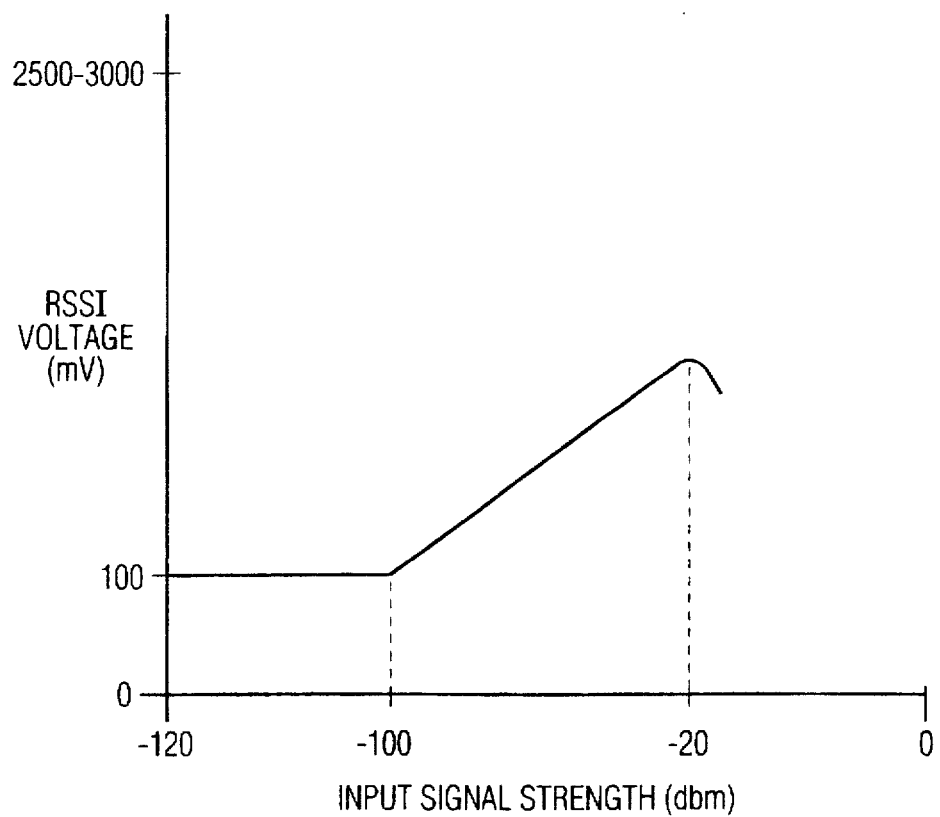
FIG. 3 is a diagram of the RSSI response of the five-stage IF amplifier circuit of the prior art.
Figure 4:
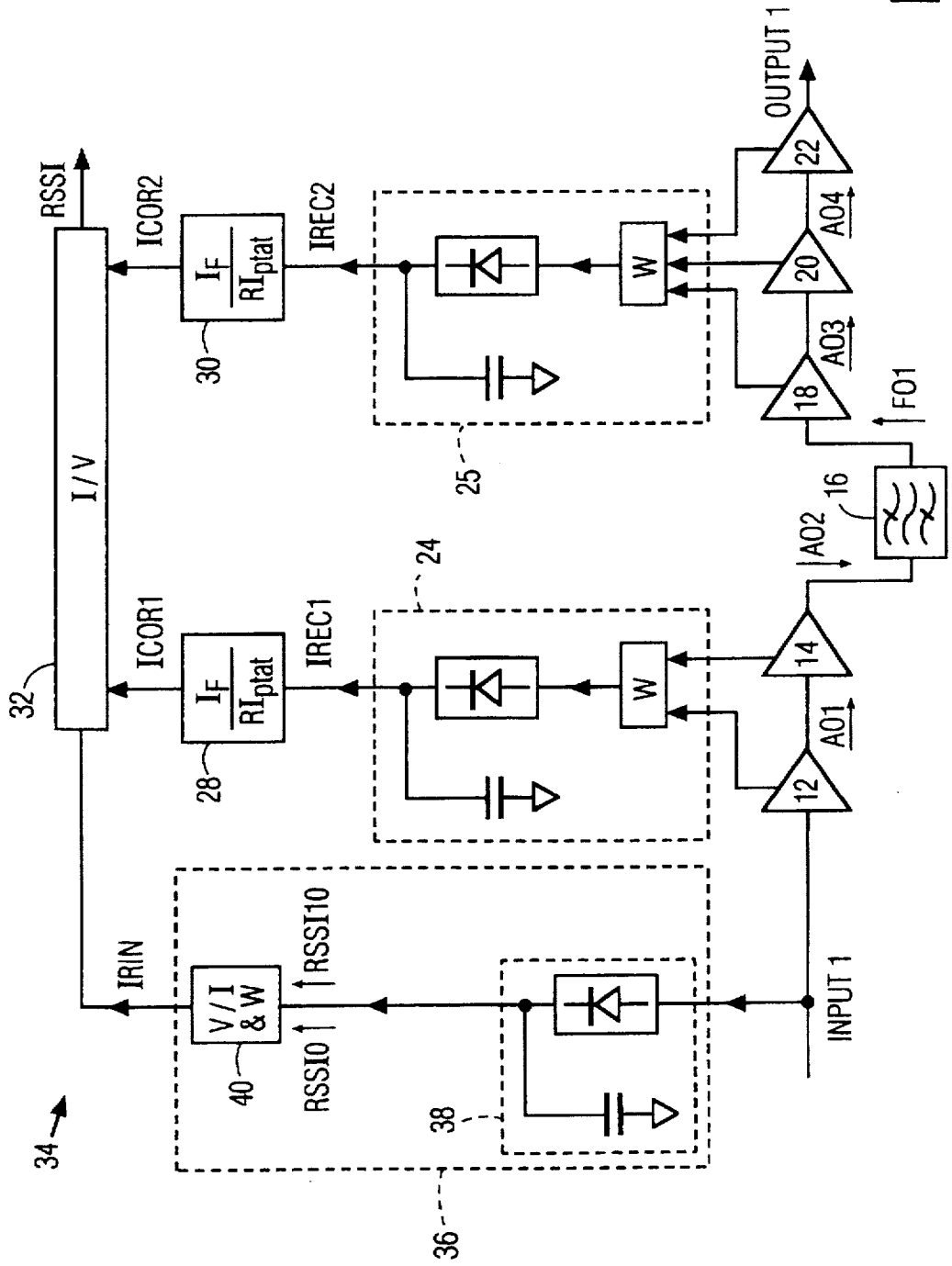
FIG. 4 is a block diagram of a five-stage IF amplifier according to the present invention.

FIG. 4 shows a five-stage IF amplifier with an interstage filter and log signal level detector 34 of the present invention. The five-stage IF amplifier with an interstage filter and log signal level detector 34, as shown in FIG. 4, comprises amplifiers 12 through 22, bandpass filter 16, weighting factor and rectification circuits 24 and 25, temperature correction circuits 28 and 30, and converter 32, previously described. The present invention comprises high end linear response circuit 36.

By sensing the input to log amplifier 12 through high end linear response circuit 36 for very large signals after weighting factor and rectification circuits 24 and 25 have become functional, high end linear response circuit 36 of the present invention becomes functional. When high end linear response circuit 36 of the present invention becomes functional, high end linear response circuit 36 increases the dynamic range of the five-stage IF log amplifier circuit 34 at the high end of the input signal input 1, by extending a linear response of the RSSI signal to the input signal strength.

Figure 8:
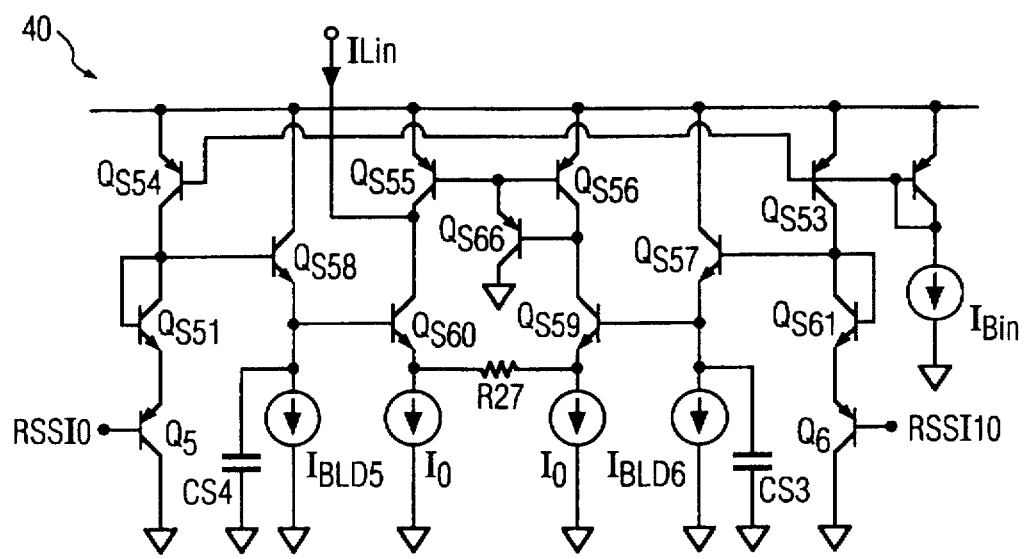
FIG. 8 is a circuit diagram of the differential peak detector and voltage to current converter, according to the present invention.

As shown in FIG. 4, high end linear response circuit 34 is coupled to the input of amplifier 12, thereby receiving signal input 1. High end linear response circuit 36 comprises rectifier circuit 38, which receives input 1 and is coupled to the input of amplifier 12. High end linear response circuit 36 also comprises differential peak detector circuit 40, which is shown in FIG. 8, and described in detail herein below.

Differential peak detector circuit 40 is coupled to the output of rectifier circuit 38, and provides an input to converter 32.

In the present invention, high end linear response circuit 36 outputs an output signal Ilin, which has a linear response to input 1, thereby adding a rectifier circuit at the input of the five-stage IF amplifier 34 before amplification of input 1 and producing a useful dynamic range for the five-stage IF amplifier circuit 34 between −100 dbm and 0 dbm. As shown in FIG. 4, input 1 is received by rectifier circuit 38.

Figure 5A:
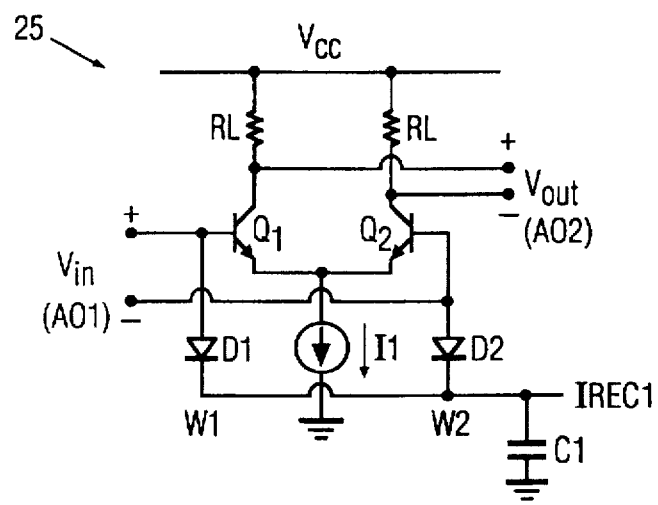
FIG. 5a is a diagram of a standard, full-wave rectifier/peak detector used at the input of the amplifier.

One implementation of a conventional full wave rectifier circuit is shown in FIG. 5a. As shown in FIG. 5a, since diodes D1 and D2 are placed directly at the input ports (Vin), diodes D1 and D2 can affect the noise and the input impedance of the first stage comprising transistors Q1 and Q2.

Figure 5B:
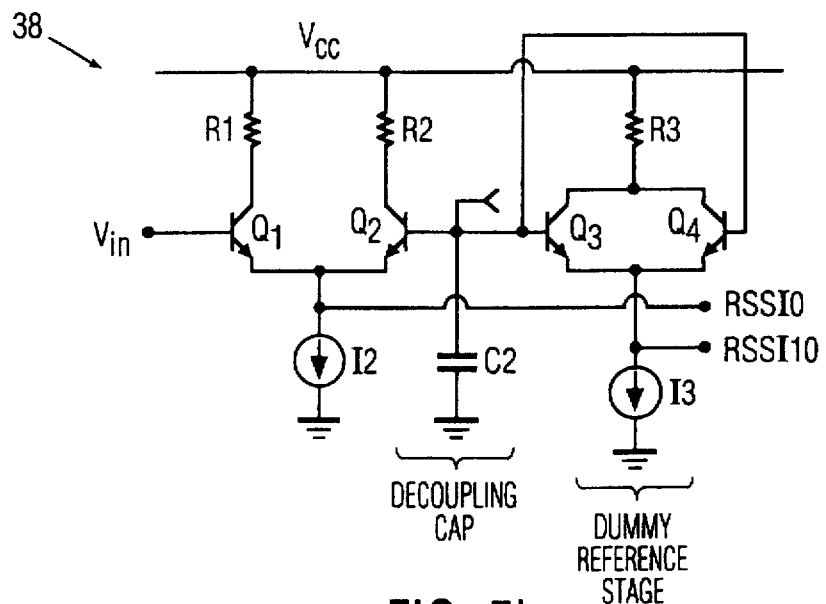
FIG. 5b is a circuit diagram of the principle used in the present invention.

FIG. 5b illustrates the principle of the rectifier circuit 38 of the present invention. As shown in FIG. 5b, load resistors R1, R2, and R3 are tied to Vcc. In a preferred embodiment, load resistors R1, R2, and R3 could each be a combination of specific resistor values and active loads, as described herein below regarding FIG. 7. As shown in FIG. 5b, resistor R1 is coupled to the collector of npn transistor Q1, resistor R2 is coupled to the collector of npn transistor Q2, and resistor R3 is coupled to the collector of each of npn transistor Q3 and npn transistor Q4. The base of npn transistor Q1 is coupled to Vin, which is input 1. The base of npn transistor Q2 is coupled to the base of npn transistor Q3, which is coupled to ground through capacitor C2. The emitter of npn transistor Q1 is coupled to the emitter of npn transistor Q2, which combination produces RSSI0. The emitter of npn transistor Q3 is coupled to the emitter of npn transistor Q4, which additive combination produces RSSI10. As described herein below, RSSI0 is the full-wave rectified version of input 1, and includes the a.c. and d.c. components thereof; further, RSSI10 is the output of the "dummy" full-wave rectified version of input 1, and includes only the d.c. components thereof.

According to FIG. 5b, as Vin becomes more positive, Q1 is turned on, which increases its current flow. As Q1 bias increases, eventually all current flows to Q1, and no current flows to Q2. As the base voltage of Q1 increases, the emitter of Q1 will follow the voltage of the base of Q1. The same effect occurs for Q2 when the voltage at the base of Q2 is greater than the voltage at the base of Q1. Hence, Q1 and Q2, which function as an amplifier, also function as a rectifier at the common emitter port of Q1 and Q2. I2 and I3 are fixed, proportional-to-temperature current sources made in a conventional bias generator (not shown).

Figure 7:
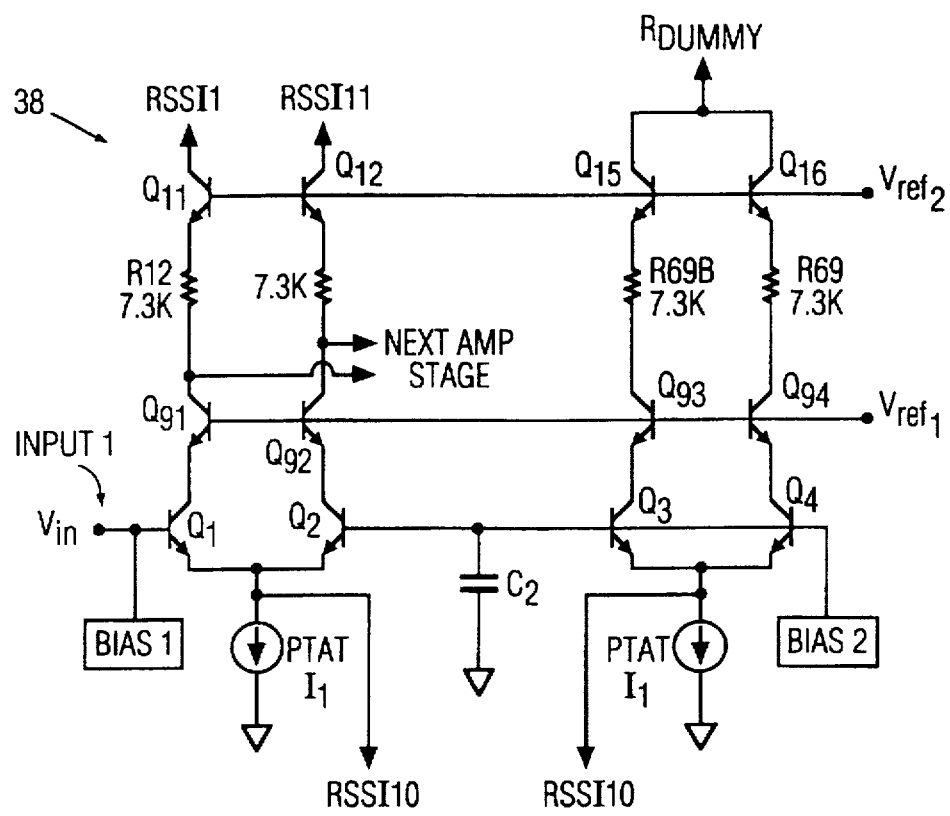
FIG. 7 is a circuit diagram of the implementation of a full-wave rectifier, according to the present invention.

FIG. 7 is a detailed circuit diagram of a preferred embodiment of the rectifier circuit 38 of the present invention. A simplified rectifier circuit 38 was shown in FIG. 5b. The transistors, resistors, and capacitors shown in FIG. 7 are conventional components and are coupled as described. Referring now to FIG. 7, input 1 is input as Vin. Vin is coupled to the base of npn transistor Q1. Transistors Q1 and Q2 comprise a differential pair amplifier. The base of Q1 is biased by bias 1 network and the base of Q2 is biased by bias 2 network. The base of Q2 is in addition bypassed to ground for a.c. signals through capacitor C2. Q91 and Q92 are cascode transistors for improved bandwidth of the gain stage made by Q1 and Q2. Vref1 and Vref2 are d.c. bias sources provided by a conventional reference generator (not shown) that generates the above-mentioned d.c. bias. The collector of Q91 and the collector of Q92 are the amplifier outputs. The bias current for the stage I1 is a PTAT (proportional to absolute temperature) current source for compensation of the gain of stage I1. Transistors Q11 and Q12 effectively operate as low impedance voltage sources and allow the current in each branch of the output of the Q1–Q2 amplifier stage to be sensed in the collector of each of Q1 and Q2, without disturbing the operation of the Q1–Q2 amplifier stage. Currents RSSI1 and RSSI2 are added after rectification and processed in the RSSI circuit to generate the received signal strength indication signal.

The stage comprised by amplifiers Q3 and Q4, Q93 and Q94, and Q15 and Q16 is a replica of the Q1–Q2 amplifier stage, except that the base of each of Q3 and Q4 are by-passed to ground via capacitor C2. Therefore, the Q3–Q4 stage operates as a "dummy" stage which generates bias references for the RSSI circuit. Rdummy is a reference current for the RSSI1 and RSSI11 signals. Similarly, RSSI10 is a reference voltage for RSSI0. The common emitter of Q1 and Q2 operates as a rectifier which outputs the bias and rectified signal. While the common emitter of Q3–Q4 outputs the bias only signal. By subtracting the output RSSI0 from RSSI10, the signal strength is obtained.

Rectifier circuit 38, which is a full-wave rectifier of the present invention, is shown in detail in FIG. 7. Referring now to FIG. 7, rectifier circuit 38 outputs signals RSSI0 and RSSI10 to differential peak detector circuit 40. RSSI0 is a full-wave rectified version, including the d.c. component, of input 1. RSSI10 is a full-wave rectified version of the d.c. component of input 1. RSSI10 is used for tracking the d.c. component of RSSI0, and is referred to as a "dummy reference generator". RSSI0 and RSSI10 each have the same d.c. component, but RSSI10 has no a.c. component. Q1 and Q2 function as the input amplifier, as well. Differential peak detector circuit 40, in addition to level shifting, detects the peak of the rectified signal and also converts the input voltages RSSI0 and RSSI10 to an output current proportional to the voltage difference. The voltage difference is then converted to a current, Ilin, which is output to converter 32.

As shown in FIG. 4, converter 32 then converts Ilin and input currents output by temperature correction circuit 38 and temperature correction circuit 32 to output voltage RSSI. RSSI of FIG. 4 exhibits a linear response to input 1 when the signal strength of input 1 ranges approximately from −20 dbm to 0 dbm.

Since the high end linear response circuit 36 of the present invention is independent of "PTAT" currents, described herein above, no compensation for the "PTAT" current is required. Therefore, in the present invention, the function of "weighting" the input signal is combined with the above-described voltage-to-current conversion in the differential peak detector circuit 40. Accordingly, the high end linear response circuit 36 extends the RSSI of the five-stage IF amplifier with an interstage filter and log signal level detector 34 by more than 10 db at the high end of the amplitude of the input signal.

Figure 6:
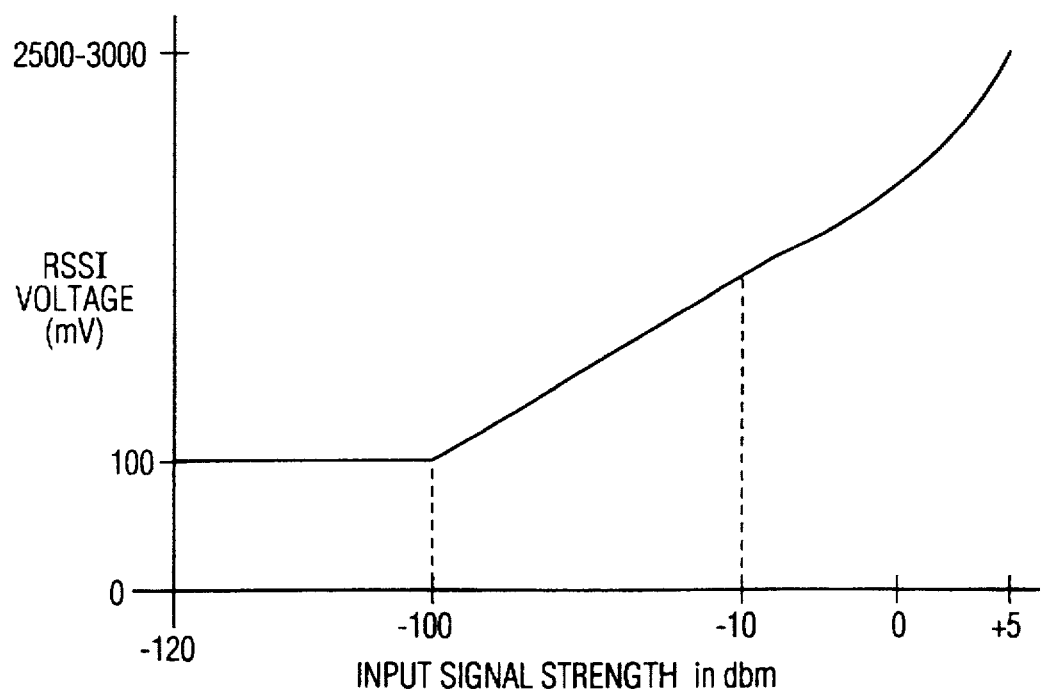
FIG. 6 is a diagram of the RSSI response of the five-stage IF amplifier circuit of the present invention.

FIG. 6 is a diagram of an RSSI response for the five-stage IF amplifier 34 of the present invention. As shown in FIG. 6, when the amplitude of the signal strength of input 1 is between −120 and −100 dbm, the RSSI signal is 100 mv. When the amplitude of the signal strength of input 1 is between −100 dbm and approximately 0 dbm, the RSSI voltage is linearly-related to the logarithm of the amplitude of the signal strength of input 1. Not until the amplitude of the signal strength of input 1 approaches 0 dbm does the RSSI response begin to drop off and deviate from the logarithm of the amplitude. Therefore, as shown in FIG. 6, the present invention extends the useful dynamic range as the amplitude of input 1 increases to approximately 0 dbm.

FIG. 8 is a circuit diagram of a preferred embodiment of differential peak detector circuit 40. The above-mentioned subtraction is performed in the differential peak detector circuit 40 shown in FIG. 8. As shown in FIG. 8, the RSSI0 and the RSSI10 inputs are fed to a very symmetric circuit. RSSI0 is fed to the base of transistor Q5, and RSSI10 is fed to the base of transistor Q6. Transistors QS51 and QS61 level shift the signal up by one diode drop. QS58 and QS57 are emitter followers that are biased by very small currents IBLD5 and IBLD6.

Capacitors CS4 and CS3 are charged by positive signals from the emitters of QS58 and QS59. Since the discharge path for capacitors CS4 and CS3 is limited to the small currents IBLD5 and IBLD6, and the based currents of QS60 and QS59, capacitors CS4 and CS3 remain charged with the positive peak of the input signal; hence, capacitors CS4 and CS3 are peak detectors. The positive peaks of the signals RSSI0 and RSSI10 are thus detected and stored on capacitors CS4 and CS3, respectively.

The stage comprising QS60 and QS59 is a differential voltage to current converter. Any voltage difference on the bases of QS60 and QS59 is converted to a current in resistor R27. The values for the bias (IO) and the resistor R27 are selected to make the current flowing through R27 proportional to the input difference between the bases of QS60 and QS59. In the case of a large signal being received by the receiver circuit, the base of QS60 will increase, causing an increase in the collector current of QS60 and a decrease in the collector current of QS59. The current mirror comprising transistors QS55, QS56, and QS66 will make the collector current of QS55 equal to the collector current of QS59. The excess current in the collector of QS60 must be drawn from the Ilin branch. The excess current in QS60 is exactly proportional to the peak of the received signal and is equal to the signal strength of the received signal.

Figure 9:
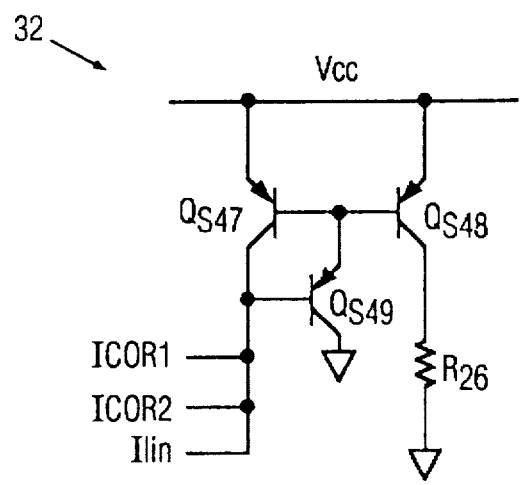
FIG. 9 is a circuit diagram of adding the output of the differential peak detector of the present invention to produce RSSI.

FIG. 9 shows a preferred embodiment of the converter 32, and specifically circuitry adding Ilin to the combination of Icor1 and Icor2 in converter 32. Converter 32 adds currents Ilin, Icor1, and Icor2 together, and converts that total to output voltage RSSI.

As shown in FIG. 9, pnp transistors QS47, QS48, and QS49 form a current mirror. Therefore, the value of the current flowing from Vcc through the emitter and into the collector of pnp transistor QS47 is the same as the value of the current flowing from Vcc through the emitter and into the collector of pnp transistor QS48. Accordingly, as the value of Ilin increases, along with the values of Icor1 and Icor2, the value of the current in the collector of transistor QS48 increases, and allows current to flow into resistor R26, creating a voltage drop across resistor R26 which is RSSI. In a preferred embodiment, resistor R26 is 82 kilo-ohms.

Therefore, as shown in FIGS. 8 and 9, npn transistors 59 and 60 convert the voltage difference, which is a d.c. voltage, on the bases of npn transistors 59 and 60 to a current Ilin which is summed into the collector of pnp transistor QS47. Since the rectifier circuit of the present invention is independent of the "PTAT" currents, no compensation for the "PTAT" current is needed, allowing the "weighting" function to be combined with the voltage-to-current conversion, thereby extending the linear RSSI response to the input signal by more than 10 db at the high end of the amplitude of the input signal.

The present invention is not limited to the embodiments, described above, but also encompasses variations thereof.

What is claimed is:

1. An intermediate frequency (IF) amplifier receiving an input signal and outputting an output signal, said IF amplifier comprising:

amplifier means for receiving the input signal, for amplifying the input signal into an amplified input signal, for weighting the amplified input signal into a weighted signal, for rectifying the weighted signal into a rectified signal, for correcting the rectified signal for effects of temperature into a corrected signal, and for outputting the corrected signal;

a linear response circuit receiving the input signal and outputting a linear response signal linearly related to the input signal, the linear response circuit comprising a rectifier circuit receiving the input signal, and outputting a first signal having a first d.c. component and a first a.c. component, and a second signal having a second d.c. component, said first d.c. component being equal to said second d.c. component; and a differential peak detector circuit, coupled to the rectifier circuit, for receiving the first signal and the second signal, and for converting the first signal and the second signal into the linear response signal; and a converter circuit, coupled to the linear response circuit and to the amplifier means, adding the corrected signal and the linear response signal together to produce a strength indication signal, and for outputting a received signal strength indication signal based on the strength indication signal.

2. The intermediate frequency amplifier according to claim 1, wherein the differential peak detector circuit comprises:

first peak detecting means for detecting a first peak of the first signal;

second peak detecting means for detecting a second peak of the second signal; and means for determining a peak difference between the first peak and the second peak proportional to an amplitude of the input signal and for generating the linear response signal based on the peak difference.

3. The intermediate frequency amplifier according to claim 1, wherein the rectifier circuit comprises a first current mirror generating the first signal based on the input signal and a second current mirror generating the second signal based on the input signal.

4. The intermediate frequency amplifier according to claim 1, wherein a dynamic range of the received signal strength indication signal corresponding to the corrected signal is linearly related to an amplitude of the input signal between −100 dbm and −20 dbm and a dynamic range of the received signal strength indication signal corresponding to the linear response signal is linearly related to the amplitude of the input signal between −20 dbm and 0 dbm.

5. The intermediate frequency amplifier according to claim 1, wherein the converter circuit comprises:

a current mirror receiving the linear response signal, adding the linear response signal to the corrected signal, and producing an added signal, and a resistor coupled to the current mirror, and producing the voltage linearly related to the amplitude of the input signal based on the added signal.

6. A method of producing a received signal strength indicator signal linearly related to a signal strength of an input signal, said method comprising the steps of:

(a) receiving the input signal, rectifying without amplifying the input signal to produce a linear response signal linearly responsive to the input signal;

(b) amplifying the input signal to produce an amplified signal, rectifying the amplified signal to produce a rectified and amplified signal, and correcting the rectified and amplified signal for effects of temperature to produce a temperature-corrected signal; and (c) adding the linear response signal and the temperature-corrected signal together to produce an added signal and converting the added signal to a voltage linearly related to the signal strength of the input signal.

7. The method recited in claim 6, wherein step (b) further comprises the step of (b-1) correcting the rectified and amplified signal for temperature variations.

8. The method according to claim 6, wherein a dynamic range of the received signal strength indication signal corresponding to the corrected signal is linearly related to an amplitude of the input signal between −100 dbm and −20 dbm and a dynamic range of the received signal strength indication signal corresponding to the linear response signal is linearly related to the amplitude of the input signal between −20 dbm and 0 dbm.

9. An intermediate frequency (IF) amplifier receiving an input signal and outputting an output signal, said IF amplifier comprising:

amplifier means for receiving the input signal, for amplifying the input signal into an amplified input signal, for weighting the amplified input signal into a weighted signal, for rectifying the weighted signal into a rectified signal, for correcting the rectified signal for effects of temperature into a corrected signal, and for outputting the corrected signal, the corrected signal being linearly related to the signal strength of the input signal over a first range of signal strengths of the input signal;

a linear response circuit receiving the input signal and outputting a linear response signal linearly related to the input signal over a second range of signal strengths greater than the first range of signal strengths of the input signals, the linear response circuit including a rectifier circuit receiving the input signal and outputting first and second signals; and a differential peak detector circuit, coupled to the rectifier circuit, for receiving the first signal and the second signal, and for converting the first signal and the second signal into the linear response signal; and a converter circuit, coupled to the linear response circuit and to the amplifier means, adding the corrected signal and the linear response signal together to produce a strength indication signal, and for outputting a received signal strength indication signal based on the strength indication signal, the received signal strength indication signal having a continuous linear relation with the input signal over the first and second ranges of the input signal strengths.

10. The intermediate frequency amplifier according to claim 9, wherein the first signal has a first d.c. component and a first a.c. component, and the second signal has a second d.c. component, said first d.c. component being equal to said second d.c. component.

11. The intermediate frequency amplifier according to claim 10, wherein the differential peak detector circuit of the linear response circuit comprises:

first peak detecting means for detecting a first peak of the first signal;

second peak detecting means for detecting a second peak of the second signal; and means for determining a peak difference between the first peak and the second peak proportional to an amplitude of the input signal and for generating the linear response signal based on the peak difference.

12. The intermediate frequency amplifier according to claim 10, wherein the rectifier circuit of the linear response circuit comprises a first current mirror generating the first signal based on the input signal and a second current mirror generating the second signal based on the input signal.

13. The intermediate frequency amplifier according to claim 10, wherein the converter circuit comprises:

a current mirror receiving the linear response signal, adding the linear response signal to the corrected signal, and producing an added signal, and a resistor coupled to the current mirror, and producing the voltage linearly related to the amplitude of the input signal based on the added signal.

14. The intermediate frequency amplifier according to claim 9, wherein a dynamic range of the received signal strength indication signal corresponding to the corrected signal is linearly related to an amplitude of the input signal between −100 dbm and −20 dbm and a dynamic range of the received signal strength indication signal corresponding to the linear response signal is linearly related to the amplitude of the input signal between −20 dbm and 0 dbm.

* * * * *